United States Patent
Li et al.

(10) Patent No.: US 10,726,351 B1
(45) Date of Patent: Jul. 28, 2020

(54) SYSTEM AND METHOD FOR CONTROLLING SUPERCONDUCTING QUBITS USING SINGLE FLUX QUANTUM LOGIC

(71) Applicant: Wisconsin Alumni Research Foundation, Madison, WI (US)

(72) Inventors: Kangbo Li, Madison, WI (US); Robert Francis McDermott, III, Madison, WI (US); Maxim George Vavilov, Middleton, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 16/265,867

(22) Filed: Feb. 1, 2019

(51) Int. Cl.
| | |
|---|---|
| *H03K 19/19* | (2006.01) |
| *G06N 10/00* | (2019.01) |
| *H03K 19/195* | (2006.01) |
| *B82Y 10/00* | (2011.01) |

(52) U.S. Cl.
CPC .............. *G06N 10/00* (2019.01); *B82Y 10/00* (2013.01); *H03K 19/1958* (2013.01)

(58) Field of Classification Search
CPC ... H03K 19/195; H03K 19/1954; H04B 10/90
See application file for complete search history.

(56) References Cited

U.S. PATENT DOCUMENTS

| | | | |
|---|---|---|---|
| 2015/0263736 A1* | 9/2015 | Herr .......................... | H03K 3/38 326/4 |
| 2016/0191060 A1* | 6/2016 | McDermott, III .......................... | H03K 19/1954 326/3 |
| 2016/0233965 A1* | 8/2016 | Medford ................. | H04B 10/90 |
| 2018/0054201 A1* | 2/2018 | Reagor ................ | H03K 19/195 |

OTHER PUBLICATIONS

Saad, Serwan, et al. "Independent, extensible control of same-frequency superconducting qubits by selective broadcasting." npj Quantum Information 2 (2016): 16029.
Barends, R., et al. "Rolling quantum dice with a superconducting qubit." Physical Review A 90.3 (2014): 030303.
Barends, R., et al. "Logic gates at the surface code threshold: Superconducting qubits poised for fault-tolerant quantum computing." arXiv preprint arXiv:1402.4848 (2014).
Bowdrey, Mark D., et al. "Fidelity of single qubit maps." Physics Letters A 294.5-6 (2002): 258-260.

(Continued)

*Primary Examiner* — Dzung D Tran
(74) *Attorney, Agent, or Firm* — Quarles & Brady LLP

(57) ABSTRACT

A system and method for controlling superconducting qubits is provided. In some aspects the method includes assembling, using a controller of a quantum computing system, a pulse subsequence that comprises pairs of voltage pulses timed symmetrically with respect to a period corresponding to a qubit frequency of a superconducting qubit in the quantum computing system. The method also includes generating, using the controller, a pulse sequence using a repetition of a pulse subsequence. The method further includes controlling the superconducting qubit by applying the pulse sequence to the superconducting qubit using a single flux quantum ("SFQ") driver coupled thereto.

15 Claims, 11 Drawing Sheets
(8 of 11 Drawing Sheet(s) Filed in Color)

(56) References Cited

OTHER PUBLICATIONS

Campagne-Ibarcq, Philippe, et al. "Persistent control of a superconducting qubit by stroboscopic measurement feedback." Physical Review X 3.2 (2013): 021008.
Chen, Zijun, et al. "Measuring and suppressing quantum state leakage in a superconducting qubit." Physical review letters 116.2 (2016): 020501.
Chow, Jerry M., et al. "Optimized driving of superconducting artificial atoms for improved single-qubit gates." Physical Review A 824 (2010): 040305.
Clarke, John, and Frank K. Wilhelm. "Superconducting quantum bits." Nature 453.7198 (2008): 1031.
Feynman, Richard P. "Simulating physics with computers." International journal of theoretical physics 21.6 (1982): 467-488.
Fowler, Austin G., et al. "Surface codes: Towards practical large-scale quantum computation." Physical Review A 86.3 (2012): 032324.
Koch, Jens, et al. "Charge-insensitive qubit design derived from the Cooper pair box." Physical Review A 76.4 (2007): 042319.
Leonard, Jr., Edward, et al. "Digital coherent control of a superconducting qubit." Physical Review Applied 11.1 (2019): 014009.
Liebermann, Per J., and Frank K. Wilhelm. "Optimal Qubit Control Using Single-Flux Quantum Pulses." Physical Review Applied 6.2 (2016): 024022.
Likharev, Konstantin K., and Vasilii K. Semenov. "RSFQ logic/memory family: A new Josephson-junction technology for sub-terahertz-clock-frequency digital systems." IEEE Transactions on Applied Superconductivity 1.1 (1991): 3-28.
Lucero, Erik, et al. "Reduced phase error through optimized control of a superconducting qubit." Physical Review A 82.4 (2010): 042339.
McDermott, R., and M. G. Vavilov. "Accurate qubit control with single flux quantum pulses." Physical Review Applied 2.1 (2014): 014007.
McDermott, R., et al. "Quantum—classical interface based on single flux quantum digital logic." Quantum science and technology 3.2 (2018): 024004.
Motzoi, Felix, et al. "Simple pulses for elimination of leakage in weakly nonlinear qubits." Physical review letters 103.11 (2009): 110501.
Riste, D., et al. "Feedback control of a solid-state qubit using high-fidelity projective measurement." Physical review letters 109.24 (2012): 240502.
Steffen, Matthias, John M. Martinis, and Isaac L. Chuang. "Accurate control of Josephson phase qubits." Physical Review B 68.22 (2003): 224518.
Versluis, R., et al. "Scalable quantum circuit and control for a superconducting surface code." Physical Review Applied 8.3 (2017): 034021.
Vijay, R., et al. "Stabilizing Rabi oscillations in a superconducting qubit using quantum feedback." Nature 490.7418 (2012): 77.

\* cited by examiner

SYSTEM AND METHOD FOR CONTROLLING SUPERCONDUCTING QUBITS USING SINGLE FLUX QUANTUM LOGIC

STATEMENT REGARDING FEDERALLY SPONSORED RESEARCH

This invention was made with government support under 1720304 awarded by the National Science Foundation. The government has certain rights in the invention.

BACKGROUND

The field of the disclosure is related to superconducting circuits. More particularly, the disclosure relates to systems and methods for controlling superconducting qubits using single flux quantum ("SFQ") circuits.

In the field of quantum computation, the performance of quantum bits ("qubits") has advanced rapidly in recent years, with several preliminary multi-qubit initiatives aiming toward surface code architectures. In contrast to classical computational methods that rely on binary data stored in the form of definite on/off states, or classical bits, qubits take advantage of the quantum mechanical nature of quantum systems to store and manipulate data. Specifically, quantum systems can be described by multiple quantized energy levels or states, and can be represented probabilistically using a superposition of those states.

Among several implementations currently being pursued, superconductor-based qubits present good candidates for quantum computation. This is because superconducting materials have inherently low dissipation that, in principle, can produce coherence times necessary for performing useful calculations. For instance, qubits based on Josephson tunnel junctions, which include two superconducting electrodes separated by a thin insulator, are advantageous due to their strongly nonlinear behavior. Specifically, Josephson-based devices allow for breaking the degeneracy between different transition frequencies, and thereby restrict system dynamics to specific quantum states. In addition, complex superconducting circuits can be micro-fabricated using conventional integrated-circuit processing techniques. This allows scaling to architectures that include a large number of qubits.

A fault-tolerant scalable quantum computer can provide a computational power far exceeding that of a classical computer, and superconducting qubits are a promising way to build such a machine. However, large-scale quantum information processing based on surface codes imposes strict challenges on qubit operation and control. For instance, by some estimates, a general-purpose fault-tolerant quantum computer will likely include millions of physical qubits. Using current implementations, controlling such large-scale quantum computer through qubit manipulation, error detection, and readout, would involve a massive hardware overhead.

Conventionally, qubits are controlled using pulses generated by single-sideband modulation of a microwave carrier tone. Accurate control of both the in-phase and quadrature pulse amplitudes allows arbitrary rotations on the Bloch sphere. However, utilizing microwave pulses introduce the possibility of crosstalk between neighboring qubit channels of a qubit array. To minimize crosstalk, different qubits in the array are often biased at different operating frequencies. This approach also makes it possible to address a large-scale multi-qubit array with a relatively small number of carrier tones, which results in significant hardware savings.

In some approaches, control waveforms are recycled and used across a qubit array. However, it is not clear that recycling waveforms allows high-fidelity control. This is because such waveforms represent the convolution of the applied waveforms and transfer functions of the wiring in the cryostat system. However, transfer functions are generally not well controlled, and can vary substantially across the array. Moreover, having separate high-bandwidth control lines for each qubit channel entails a massive heat load on the milli-Kelvin stage of the cryostat system. Furthermore, the significant latency associated with the round trip signal travel from the quantum array to the room-temperature classical coprocessor will limit the performance of any scheme used for high-fidelity projective measurement and feedback to stabilize the qubits in the array.

Given the above, there exists a need for systems and methods yielding scalable quantum computation that includes the ability to perform rapid high-fidelity control and measurement of both single qubits and multi-qubit parity, while controlling the resources utilized.

SUMMARY

The present disclosure overcomes the drawbacks of previous technologies. In one aspect of the disclosure, a quantum computing system is provided. The system includes a qubit architecture comprising a superconducting qubit described by a qubit frequency, and a single flux quantum ("SFQ") driver coupled to the superconducting qubit, wherein the SFQ driver is configured to provide a pulse sequence to control the superconducting qubit, the pulse sequence being generated using a repetition of a pulse subsequence that comprises pairs of voltage pulses timed symmetrically with respect to a period corresponding to the qubit frequency.

In another aspect of the disclosure, a method for controlling superconducting qubits is provided. The method includes assembling, using a controller of a quantum computing system, a pulse subsequence that comprises pairs of voltage pulses timed symmetrically with respect to a period corresponding to a qubit frequency of a superconducting qubit in the quantum computing system. The method also includes generating, using the controller, a pulse sequence using a repetition of a pulse subsequence. The method further includes controlling the superconducting qubit by applying the pulse sequence to the superconducting qubit using a single flux quantum ("SFQ") driver coupled thereto.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
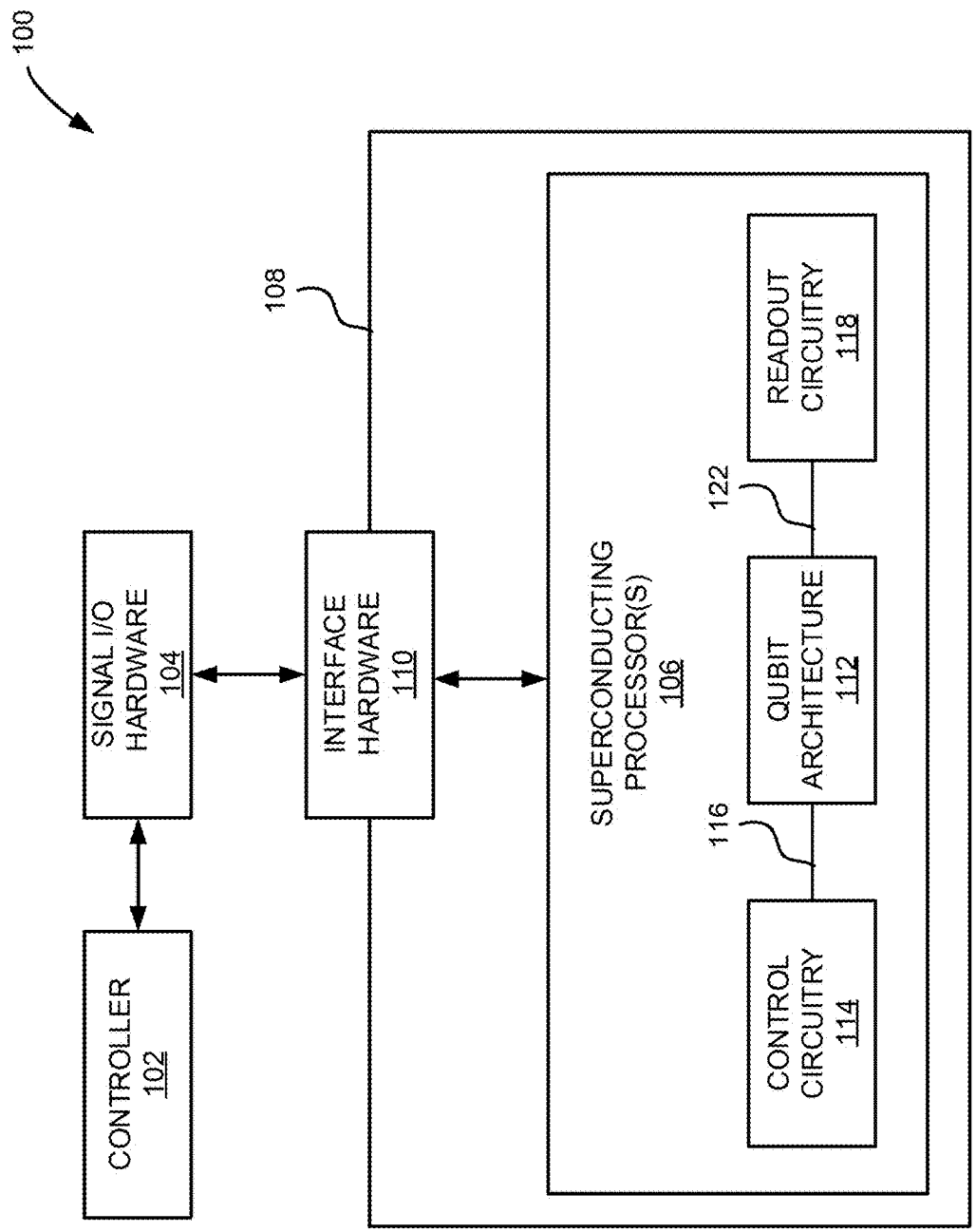
FIG. 1A is a schematic of a quantum computing system, in accordance with the present disclosure.

Conventional methods for controlling a qubit generally utilize resonant microwave pulses to realize arbitrary rotations over the Bloch sphere, which is a geometrical representation of the state of a two-level system. Amplitude modulation of the microwave concentrates drive power at the frequency of interest, and the pulse shape minimizes power at nearby transition frequencies to avoid excitation out of the qubit manifold. However, such approaches are limited in their applicability to scalable quantum computing systems due to the complex and expensive resources required.

Computational burden may be reduced by integrating a classical coprocessor unit with the qubits at the milli-Kelvin stage. In this approach, coherent control may be achieved by irradiating qubits with trains of quantized flux pulses produced using Single Flux Quantum (SFQ) digital logic. Generally, SFQ digital logic circuits generate, manipulate and store classical bits of information, or logical "0" and "1" values, using voltage pulses, or fluxons, that propagate ballistically along passive superconducting microstrip lines or active Josephson transmission lines. That is, classical bits of information are stored by way of a presence or absence of a phase slip across a Josephson junction in a given clock cycle. The phase slip results in a voltage pulse whose time integral is precisely quantized to the superconducting flux quantum $\Phi_0=h/2e$. For typical parameters, SFQ pulse amplitudes are of order 1 mV and pulse durations are around 2 ps, which is roughly two orders of magnitude shorter than the typical qubit oscillation period. As a result, each SFQ pulse imparts a delta function-like kick to the qubit that induces a coherent rotation in the qubit subspace.

The fidelity achieved using such SFQ-generated pulse trains, however, may be limited by leakage out of the computational subspace. For example, using a resonant sequence where SFQ pulse spacing is matched to the qubit oscillation period, fidelities around 99.9% may be obtained for gate times around 20 ns and typical values of qubit anharmonicity. These fidelities are likely insufficient for fault-tolerant operations in a large-scale surface code array. To achieve SFQ-based gates with higher fidelity, SFQ bits can be clocked to the qubit at a higher rate. In one previous proof-of-principle demonstration, a genetic algorithm was used to derive SFQ pulse trains with variable pulse-to-pulse timings that showed low leakage and gate fidelities better than 99.99%. However, a large number of bits was required to achieve the higher fidelity, which presents serious obstacles to achieving practical large-scale implementations. In addition, that approach provided no intuition as to why a particular sequence would yield good performance.

By contrast, the present disclosure introduces a novel method to derive hardware-efficient SFQ control sequences for scalable qubit control, referred to herein as SCALable Leakage Optimized Pulse Sequences (SCALLOPS). As detailed below, qubit control sequences may be constructed using short subsequences of classical bits that can be repeatedly streamed. Leakage is minimized at the subsequence level, and because the subsequences are short, it is possible to perform efficient search over the subsequence space in order to optimize gate fidelity. For SFQ clock frequency a factor of a few greater than the characteristic qubit frequency, high-fidelity qubit rotations can be achieved for a large number of discrete qubit frequencies, as required for low-crosstalk control of a large-scale qubit array designed to implement the surface code.

Turning now to FIG. 1A, an example system 100 for use in quantum information processing or quantum computation, in accordance with the present disclosure, is shown. In some embodiments, the system 100 may include a controller 102 and signal input/output (I/O) hardware 104 in communication with the controller 102. The system 100 may also include one or more superconducting processors 106 contained in a housing unit 108, where the superconducting processor(s) 106 is configured to perform a variety of quantum computations or quantum information processing. In addition, the system 100 may also include various interface hardware 110 for communicating and controlling signals between the signal I/O hardware 104 and the superconducting processor(s) 106.

The signal I/O hardware 104 may include various electronic systems, hardware and circuitry capable of a wide range of functionality. For example, the signal I/O hardware 104 may include various voltage sources, current sources, signal generators, amplifiers, filters, digitizers, mixers, multiplexers, voltmeters, digital/analog oscilloscopes, data acquisition cards, digital/analog signal controllers and/or processors, modulators, demodulators, logic blocks, and other equipment. In some implementations, the signal I/O hardware 104 may include a field programmable gate array (FPGA) configured to generate and provide multi-bit patterns to be used by an SFQ driver to control one or more qubits.

In general, the controller 102 may direct the signal I/O hardware 104 to provide various signals to the superconducting processor(s) 106, as well as detect signals therefrom via the interface hardware 110. In some implementations, the controller 102 may also control various other equipment of the system 100, such as various pumps, valves, and so forth. In some aspects, the controller 102 may include a programmable processor or combination of processors, such as central processing units (CPUs), graphics processing units (GPUs), and the like. As such, the controller 102 may be configured to execute instructions stored in a non-transitory computer readable-media. In this regard, the controller 102 may be any computer, workstation, laptop or other general purpose or computing device. Additionally, or alternatively, the controller 102 may also include one or more dedicated processing units or modules that may be configured (e.g. hardwired, or pre-programmed) to carry out steps, in accordance with aspects of the present disclosure.

The housing unit 108 is configured to control the environment to which the superconducting processor(s) 106 is exposed. For instance, the housing unit 108 may include various components and hardware configured to control the temperature of the superconducting processor(s) 106, as well as the liquid and/or gas mixture surrounding the superconducting processor(s) 106. In addition, the housing unit 108 may also be configured to control external noise signals, such as stray electromagnetic signals. To this end, the housing unit 108 may include various shielding units and filters. By way of example, the housing unit 108 may include, or be part of, a dilution refrigerator, or other low-temperature system or cryostat, that is capable of operating over a broad range of temperatures, including temperatures less than the critical temperature of the superconductor materials in the superconducting processor(s) 106 (e.g. temperatures less than 4 Kelvin).

The interface hardware 110 provides a coupling between the signal I/O hardware 104 and the superconducting quantum processor(s) 106, and may include a variety of hardware and components, such as various cables, wiring, RF elements, optical fibers, heat exchanges, filters, amplifiers, stages, and so forth.

As shown in FIG. 1A, the superconducting processor(s) 106 may include a qubit architecture 112 connected to control circuitry 114 by way of various control coupling(s) 116. The qubit architecture 112 may include any number of qubits configured in any manner. In some implementations, the qubit architecture 112 may include one or more transmon qubits (e.g. xmon qubits). However, the qubit architecture 112 may include other qubit types including charge qubits, flux qubits, phase qubits, and others.

Figure 1B:
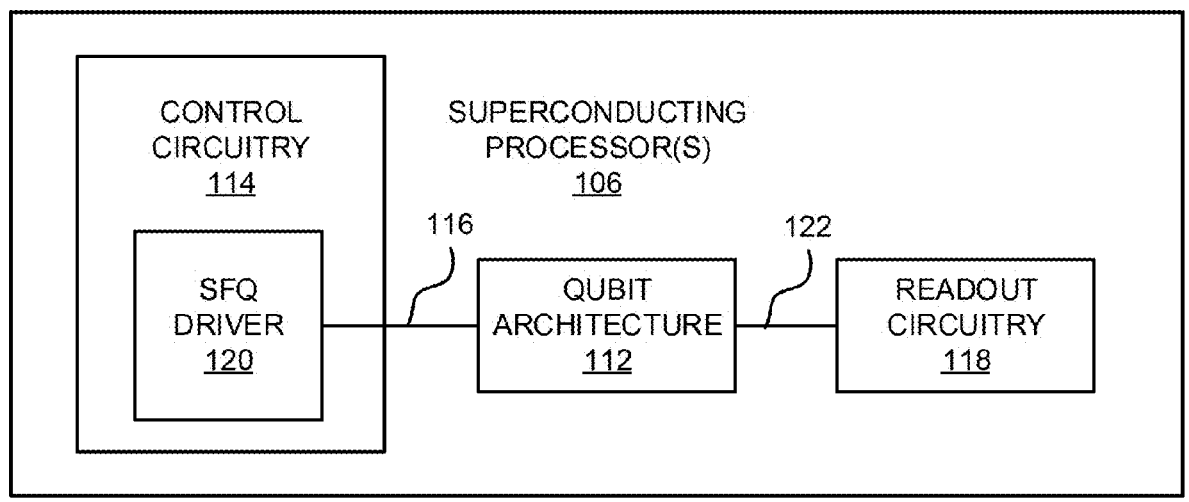
FIG. 1B is a schematic of example superconducting quantum processor(s) for the quantum computing system of FIG. 1A.
Figure 1C:
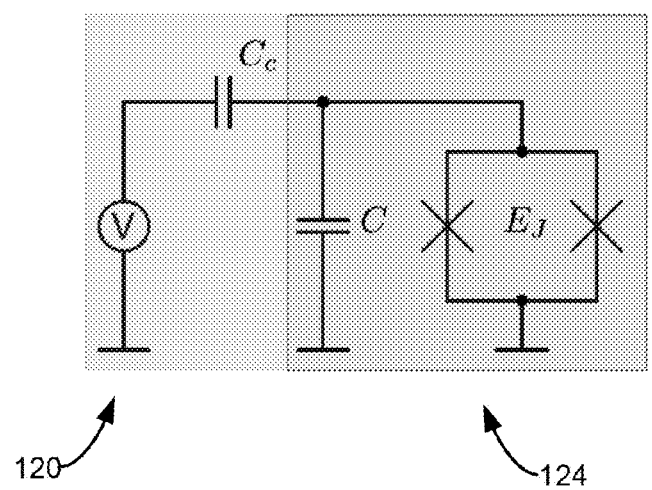
FIG. 1C is circuit diagram of an example superconducting quantum processor in which a SFQ driver is capacitively coupled to a transmon qubit, in accordance with the present disclosure.

The control circuitry 114 may be in communication with the signal I/O hardware 104, and configured to control qubits in the qubit architecture 112 by providing various control signals thereto. In some implementations, as shown in FIG. 1B, the control circuitry 114 includes an SFQ driver 120 that is coupled to the qubit architecture 112. For purposes of illustration, FIG. 1C shows an example diagram of an SFQ driver 120 capacitively coupled to a transmon qubit 124. In general, the SFQ driver 120 may be configured to generate and provide a pulse sequence to control qubits in the qubit architecture 112. This may be accomplished using by way of the signal I/O hardware 104, which as directed by the controller 102, may initiate and control the timing, intensity and repetition of voltage pulses provided by the SFQ driver 120.

In accordance with aspects of the present disclosure, the pulse sequence generated by the SFQ driver 120 includes a plurality of voltage pulses (i.e. SFQ pulses) having variable pulse-to-pulse temporal intervals. As will be described in detail below, the length of the voltage pulse sequence (i.e. the number of pulses in each sequence) and the pulse-to-pulse temporal spacing, or timing intervals between the pulses, may be optimally selected to perform effective control (e.g. high-fidelity operations), minimize leakage outside the computational space and reduce hardware overhead.

Other example control signals directed by the control circuitry 114 to the qubit architecture 112 may also include microwave irradiation signals, current signals, voltage signals, magnetic signals, and so on. To this end, the control circuitry 114 may include various other circuitry, including any number of linear and non-linear circuit elements, such as Josephson junctions, inductors, capacitors, resistive elements, superconductive elements, transmission lines, waveguides, gates, and the like.

The control couplings 116 providing a communication between the qubit architecture 112 and control circuitry 114 may configured to transmit, modulate, amplify, or filter, the pulse sequence generated using the control circuitry 114. Such control couplings 116 may include various circuitry, including capacitive or inductive elements, passive superconducting microstrip lines, active Josephson transmission lines, including any number of Josephson junctions, and so forth.

Referring again to FIG. 1A, the qubit architecture 112 may also be connected to readout circuitry 118 via readout coupling(s) 122. The readout circuitry 118 may be configured to perform readout on qubits in the qubit architecture 112, and provide corresponding signals to the signal I/O hardware 104. As non-limiting examples, the readout circuitry 118 may include various resonant cavities, logic circuits, as well as any number of linear and non-linear circuit elements, such as Josephson junctions, inductors, capacitors, resistive elements, superconductive elements, transmission lines, waveguides, gates, and the like. In some aspects, the controller 102 may direct the signal I/O hardware 104 to provide signals for modulating or tuning the control couplings 116 and/or readout couplings 122.

In certain desired configurations, the control couplings 116 and/or readout couplings 122 may be designed such that non-equilibrium quasiparticles generated in the control circuitry 114 or readout circuitry 118 are isolated from the qubit architecture 112 in a manner intended to avoid the introduction of degrees of freedom leading to quantum decoherence. For example, quasiparticle poisoning can be mitigated by avoiding direct galvanic connection between the signal and ground traces of the qubit architecture 112 and the control circuitry 114 and/readout circuitry 118. This may be achieved using a modular approach, as described in R. McDermott et al. ("Quantum-Classical Interface Based on Single Flux Quantum Digital Logic," Quantum Sci. Technol. 3, 024004 (2018)), which is incorporated herein by reference, in its entirety.

The present SCALLOPS approach will now be described in more detail. By way of illustration, a fixed SFQ clock frequency of 25 GHz is considered, so that SFQ pulses are delivered to the qubit at intervals that are integer multiples of the 40 ps clock period. In addition, transmon qubits with fixed anharmonicity $(\omega_{10}-\omega_{21})/2\pi$ of 250 MHz are considered, where $\omega_{10} \equiv \omega_q$ is the qubit transition frequency and $\omega_{21}$ is the transition frequency between the qubit $|1\rangle$ state and the noncomputational $|2\rangle$ state. Finally, for the sake of concreteness high fidelity for a single gate, the $Y_{\pi/2}$ rotation, is targeted. However, it may be appreciated that the present SCALLOPS approach is readily applied to various single-qubit operations, as well as various other qubit types including charge qubits, flux qubits, phase qubits, and others. In addition, as detailed below, high-fidelity control is possible for up to and over 20 qubit frequencies spanning the range from 4.5 to 5.5 GHz, with optimal gate fidelity achieved when an integer multiple of the qubit frequency is matched to an integer multiple of the clock frequency.

To start, a conventional transmon qubit coupled via a small capacitance C to an SFQ driver is considered, as shown in FIG. 1C. The SFQ driver may be modeled as a time-dependent voltage source $V_{SFQ}(t)$. First, the Hamiltonian of the undriven transmon may be written as:

$$H_{fr} = \frac{\hat{Q}^2}{2C'} - E_J \cos\hat{\varphi}, \tag{1}$$

where $\hat{Q}$ and $\hat{\varphi}$ are the charge and phase operators of the transmon, and $E_J$ is the transmon Josephson energy, and $C'=C_c+C$ is the sum of the coupling capacitance $C_c$ and the transmon self-capacitance C. $H_{fr}$ can be diagonalized in closed form, with the resulting energy eigenfunctions $\langle\varphi|\gamma\rangle$ and energies $E_\gamma$ represented by the Mathieu functions and coefficients.

Interaction between the transmon and the SFQ pulse driver adds the following term to the Hamiltonian:

$$H_{SFQ}(t) = \frac{C_c}{C'} V_{SFQ}(t)\hat{Q}. \tag{2}$$

where the SFQ pulse $V_{SFQ}(t)$ satisfies the condition $$\int_{-\infty}^{\infty} V_{SFQ}(t)dt = \Phi_0.$$

Since we pulse width (typically around 2 ps) is much less than the Larmor period (typically around 200 ps) of the transmon, the SFQ pulse may be modeled by a Dirac delta function: $V_{SFQ}(t)=\Phi_0\delta(t)$. The charge operator can be constructed in the basis of $|\gamma\rangle$ once $H_{fr}$ is diagonalized. The free evolution of the transmon then becomes $$U_{fr}(t) = \exp\left(-\frac{i}{\hbar}\sum |\gamma\rangle\langle\gamma| E_\gamma t\right). \tag{3}$$

The time evolution for a transmon subjected to an SFQ pulse is $$U_{SFQ}=\exp(-i\Phi_0(C_c/C')\hat{Q}). \tag{4}$$

In some implementations, it may be advantageous to restrict the size of the transmon Hilbert space in order to accelerate the search for high-fidelity pulse sequences. Since leakage outside the computation subspace is dominated by the population of the first non-computational state $|2\rangle$, the transmon can be truncated to a three-level qutrit. However, validation may also be performed using more complete models the transmon that include up to 7 states. Within the three-level subspace, the operators $H_{fr}$ and $H_{SFQ}(t)$ take the form $$H_{fr}^{(3)} = \frac{\hbar\omega_q}{2}\hat{\Sigma}_z, \quad H_{SFQ}^{(3)}(t) = \frac{\hbar\omega_y(t)}{2}\hat{\Sigma}_y, \tag{5}$$

$$\hat{\Sigma}_z = \begin{bmatrix} 0 & 0 & 0 \\ 0 & 2 & 0 \\ 0 & 0 & 4-2\eta \end{bmatrix}, \quad \hat{\Sigma}_y = i\begin{bmatrix} 0 & -1 & 0 \\ 1 & 0 & -\lambda \\ 0 & \lambda & 0 \end{bmatrix}. \tag{6}$$

Here, $\omega_y(t)=-(2V(t)/\hbar)((C_c/C')\langle 1|\hat{Q}|0\rangle$, with $\eta=1-\omega_{21}/\omega_q$ representing the fractional anharmonicity of the transmon, and $\lambda=\langle 2|\hat{Q}|1\rangle/\langle 1|\hat{Q}|0\rangle$.

The three-level matrix form for the free evolution of the transmon and for the evolution of the transmon subjected to a single SFQ pulse may then be derived. Specifically, the free evolution is given by the diagonal matrix $U_{fr}^{(3)}(t)=\exp(-i\omega_q t\hat{\Sigma}_z/2)$. In the qubit subspace, the effect of $U_{fr}^{(3)}$ is a precession at a rate of $\omega_q$. For the time evolution under a single SFQ pulse, one may write $$U_{SFQ}^{(3)} = \exp\left(-\frac{i\hat{\Sigma}_y}{2}\int_{-\infty}^{\infty}\omega_y(t)dt\right) = \exp\left(\frac{-i\delta\theta\hat{\Sigma}_y}{2}\right), \tag{7}$$

where $$\delta\theta = \int_{-\infty}^{\infty}\omega_y(t)dt = (2\Phi_0/\hbar)(C_c/C')\langle 1|\hat{Q}|0\rangle \tag{8}$$

is the tip angle associated with the single SFQ pulse. Using the Cayley-Hamilton theorem on $\hat{\Sigma}_y$, the property $$\hat{\Sigma}_y^3 = (\lambda^2+1)\hat{\Sigma}_y$$

may be obtained, which yields $$\hat{\Sigma}_y^n = (\lambda^2+1)^{\frac{n-2}{2}}\hat{\Sigma}_y^2$$

for even n and $$\hat{\Sigma}_y^n = (\lambda^2+1)^{\frac{n-1}{2}}\hat{\Sigma}_y$$

for odd n. Expanding and regrouping Eqn. 7 then gives $$U_{SFQ}^{(3)} = \hat{1} + \sum_{even, n\geq 2}^{\infty}\frac{(\lambda^2+1)^{\frac{n-2}{2}}(-i\delta\theta/2)^n}{n!}\hat{\Sigma}_y^2 + \tag{9}$$

-continued $$\sum_{odd, n\geq 1}^{\infty} \frac{(\lambda^2+1)^{\frac{n-1}{2}}(-i\delta\theta/2)^n}{n!} \hat{\Sigma}_y.$$

The two sums in Eqn. 9 yield $$U_{SFQ}^{(3)} = \frac{1}{\kappa^2} \times \begin{bmatrix} \lambda^2 + \cos(\kappa\delta\theta/2) & -\kappa\sin(\kappa\delta\theta/2) & 2\lambda\sin^2(\kappa\delta\theta/4) \\ \kappa\sin(\kappa\delta\theta/2) & \kappa^2\cos(\kappa\delta\theta/2) & -\kappa\lambda\sin(\kappa\delta\theta/2) \\ 2\lambda\sin^2(\kappa\delta\theta/4) & \kappa\lambda\sin(\kappa\delta\theta/2) & 1+\lambda^2\cos(\kappa\delta\theta/2) \end{bmatrix}, \quad (10)$$

where $\kappa = \sqrt{\lambda^2+1}$.

To see the effect of a single SFQ pulse, the time evolution is compared to a y-rotation by angle $\delta\theta$ in the qubit subspace:

$$Y_{\delta\theta} = \begin{bmatrix} \cos(\delta\theta/2) & -\sin(\delta\theta/2) \\ \sin(\delta\theta/2) & \cos(\delta\theta/2) \end{bmatrix}. \quad (11)$$

It may then be observed that: (1) within the three-level model, the SFQ pulse provides a rotation in the qubit subspace that is slightly smaller than $\delta\theta$; and (2) leakage from state $|1\rangle$ to state $|2\rangle$ is first order in $\delta\theta$, while leakage from state $|0\rangle$ to state $|2\rangle$ is second order in $\delta\theta$.

The above analysis shows that coherent qubit rotations with a single SFQ pulse incurs significant excitations of non-computational states. By contrast, and in accordance with the present disclosure, composite sequences consisting of multiple SFQ pulses spaced in time by appropriately selected intervals may be used to achieve low leakage and high fidelity. As such, a high-speed SFQ clock delivering a sequence of pulses to a transmon according to a vector of binary variables S may be considered, where $S_i=0$ if no SFQ pulse is applied on the $i^{th}$ clock edge and $S_i=1$ if an SFQ pulse is applied. Using these expressions, the total time evolution operator of the gate $U_G$, time ordered in terms of clock edges, can be written as:

$$U_G = T\left\{\prod_{i}^{N_C}(\delta_{S_i,1}U_{fr}(T_c)U_{SFQ} + \delta_{S_i,0}U_{fr}(T_c))\right\}, \quad (12)$$

where T is the time ordering operator. Here, $N_c$ is the number of clock cycles in the sequence and is the clock period. The fidelity of the gate $U_G$ may then be evaluated as $$F_{avg} = \frac{1}{6}\sum_{|\alpha\rangle \in v}|\langle\alpha|U_G^\dagger Y_{\pi/2}|\alpha\rangle|^2. \quad (13)$$

The summation in Eqn. 13 runs over the six states v aligned along the cardinal directions of the Bloch sphere $$|x_\pm\rangle = \frac{|0\rangle \pm |1\rangle}{\sqrt{2}}, \quad (14)$$

$$|y_\pm\rangle = \frac{|0\rangle \pm i|1\rangle}{\sqrt{2}},$$

$$|z_+\rangle = |0\rangle, |z_-\rangle = |1\rangle,$$

and where the $Y_{\pi/2}$ gate may be represented by the following matrix in the qubit subspace:

$$Y_{\pi/2} = \frac{1}{\sqrt{2}}(|0\rangle\langle 0| + |1\rangle\langle 1| + |1\rangle\langle 0| - |0\rangle\langle 1|). \quad (15)$$

The crux of the problem then becomes the selection of a proper S so that $U_G$ becomes a high-fidelity $Y_{\pi/2}$ gate.

Figure 2A:
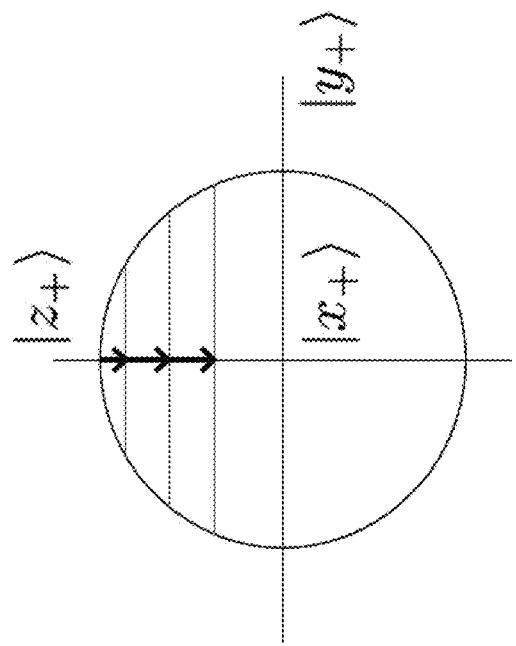
FIG. 2A is an illustration showing a resonant pulse sequence and the qubit trajectory traversed on the front hemisphere (i.e $<x><0$) of the Bloch sphere using the resonant pulse sequence.
Figure 2A:
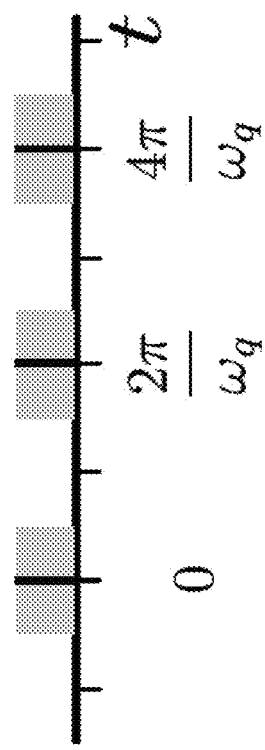

In the simplest scheme, as illustrated in FIG. 2A, a period train of SFQ pulses synchronized to the qubit oscillation period, $T_q=2\pi/\omega_q$, may be applied for coherent control. Because $U_{fr}(T_c)=\hat{1}$ in the qubit subspace, only the desired y-rotations can be induced by $U_{fr}(T_c)$ and $U_{SFQ}$. However, leakage out of the qubit space can be significant.

Figure 2B:
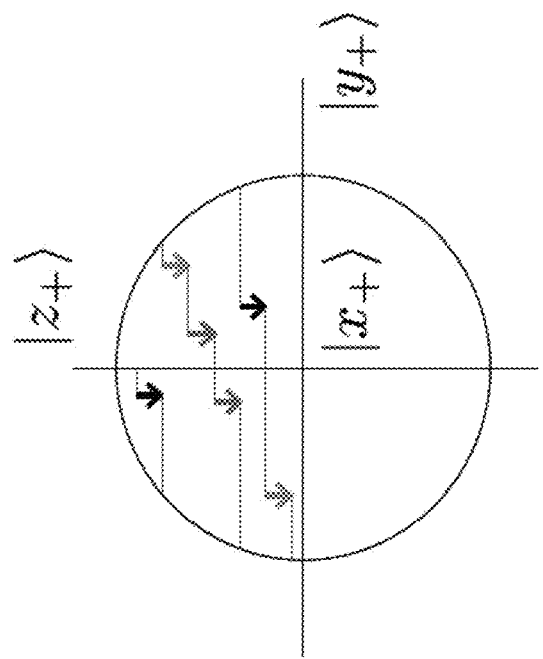
FIG. 2B is an illustration showing a symmetric pulse sequence, in accordance with aspects of the present disclosure, and the qubit trajectory traversed on the front hemisphere (i.e $<x><0$) of the Bloch sphere using the symmetric pulse sequence.
Figure 2B:
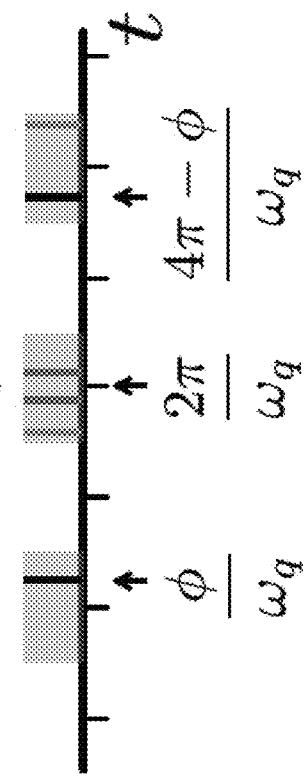

To attain higher fidelity, the present disclosure envisions employing more sophisticated sequences, with clock SFQ pulses delivered at higher rates compared to the qubit oscillation period. However, when the qubit is no longer resonant with the SFQ clock, $U_{fr}(T_c) \approx \hat{1}$ and the time evolution of an arbitrary sequence of $U_{fr}(T_c)$ and $U_{SFQ}$ is generally not confined to y-rotations. Therefore, to ensure high overlap with the target y-rotation, a sequence is assembled using symmetric pairs of SFQ pulses. As shown in FIG. 2B, the symmetric pairs of SFQ pulses are delivered to the qubit at times $\phi/\omega_q$ and $(2m\pi-2\phi)/\omega_q$, for some integer m, and occur symmetrically with respect to the time $mT_q/2$.

The symmetric pair of pulses can be represented by the tuple notation (m, $\phi$). As an example, a resonant sequence may be written in terms of symmetric pairs, where the first and last pulses form the pair $(N_q,0)$, the second and penultimate pulses form the pair $(N_q,2\pi)$, and so forth. In general, the sequence can be described as a set of symmetric pairs $(N_q,2\pi k)$ for each k between 0 and $N_q/2$.

To verify that application of symmetric pulse pairs has the net effect of a y-rotation within the qubit subspace, the time evolution operator $U_{(m,\phi)}$ associated with symmetric pair (m, $\phi$) may be inspected:

$$U_{(m,\phi)} = U_{fr}(\phi/\omega_q)U_{SFQ}U_{fr}((2m\pi-2\phi)/\omega_q) \times U_{SFQ}U_{fr}(\phi/\omega_q). \quad (16)$$

Using $U_{SFQ}$ from Eqn. 10, and expanding to first order in $\delta\theta$, one obtains $$U_{(m,\phi)} = \begin{bmatrix} 1 & -\cos(\phi)\delta\theta & 0 \\ \cos(\phi)\delta\theta & 1 & -\lambda\mu\delta\theta \\ 0 & \lambda\tau\delta\theta & \ldots \end{bmatrix} + \Theta(\delta\theta^2) \quad (17)$$

where $$\mu = \exp\left(\frac{im\pi(2\omega_q+\omega_{21})}{\omega_q}\right)\cos\left(\frac{\omega_{21}}{\omega_q}(m\pi-\phi)\right). \quad (18)$$

To first order in $\delta\theta$, it may be observed that $u_{(m,\phi)}$ is indeed a y-rotation in the qubit subspace. Moreover, the dependence of leakage on the timing of the symmetric pair through $\phi$ provides a degree of freedom that allows for optimizing subsequences to minimize leakage errors, as further detailed below. To note, although it might be tempting to set $\mu=0$ by appropriate selection of $\phi$, and thereby eliminate the 1-2 transition, the 0-1 transition will become very weak as a side effect. In fact, there is an analogous composite microwave pulse method that exploits a restricted form of this idea corresponding to m=1. However, the gate performance is no better than that of nave Gaussian pulses.

As further explained below, the construct of symmetric pairs becomes particularly advantageous when it is extended to the case of multiple pairs $(m_i, \phi_i)$ applied at times $\phi_i/\omega_q$ and $(2m_i\pi - \phi_i)$ for $i \in N$, as shown in FIG. 2B. Noteworthy, although the pulse pairs do interfere with each other because they generally do not commute, the resulting error is sufficiently small for practical choices of $\delta\theta$.

In general, the qubit oscillation period will not be commensurate with the SFQ clock, so that the optimal delivery times of the symmetric pairs will not exactly coincide with SFQ clock edges. As a result, it is necessary to round a symmetric pair to a particular pair of clock edges $n_i$ and $n_j$. To note, $n_i$ and $n_j$ can preserve the symmetry precisely if the times at which the pulses are applied are symmetric with respect to $mT_q/2$ for some integer to:

$$\frac{1}{2}\left(\frac{n_i}{N_c} \cdot \frac{2\pi N_q}{\omega_q} + \frac{n_j}{N_c} \cdot \frac{2\pi N_q}{\omega_q}\right) = mT_q/2 \qquad (19)$$

where $N_c$ is the number of clock cycles and $N_q$ is the number of qubit cycles in the sequence. This condition is equivalent to the expression $$A_{sym} = \left|\left(\frac{n_i}{N_c}N_q\right)\text{mod}1 + \left(\frac{n_j}{N_c}N_q\right)\text{mod}1 - 1\right| = 0, \qquad (20)$$

where $A_{sym}$ is a measure of the violation of symmetry due to mismatch between the SFQ clock and the qubit oscillation period. Empirically it was found that coherent pulse errors are acceptably small for pulse pairs delivered at times such that $A_{sym} < 0.05$. In the following, pulse pairs that are termed symmetric are understood to satisfy this condition.

The delivery of SFQ pulses to the qubit as symmetric pairs constrains the time evolution to the desired y-rotation. However, it is not obvious how to control multiple qubits resonating at different frequencies, as required by the surface code. For a qubit frequency that is not a subharmonic of the SFQ clock frequency, the concern is that mismatch between the qubit oscillation period and the SFQ clock will lead to phase errors, as the precession of the qubit during the gate is not an integer number of qubit cycles.

Figure 3:
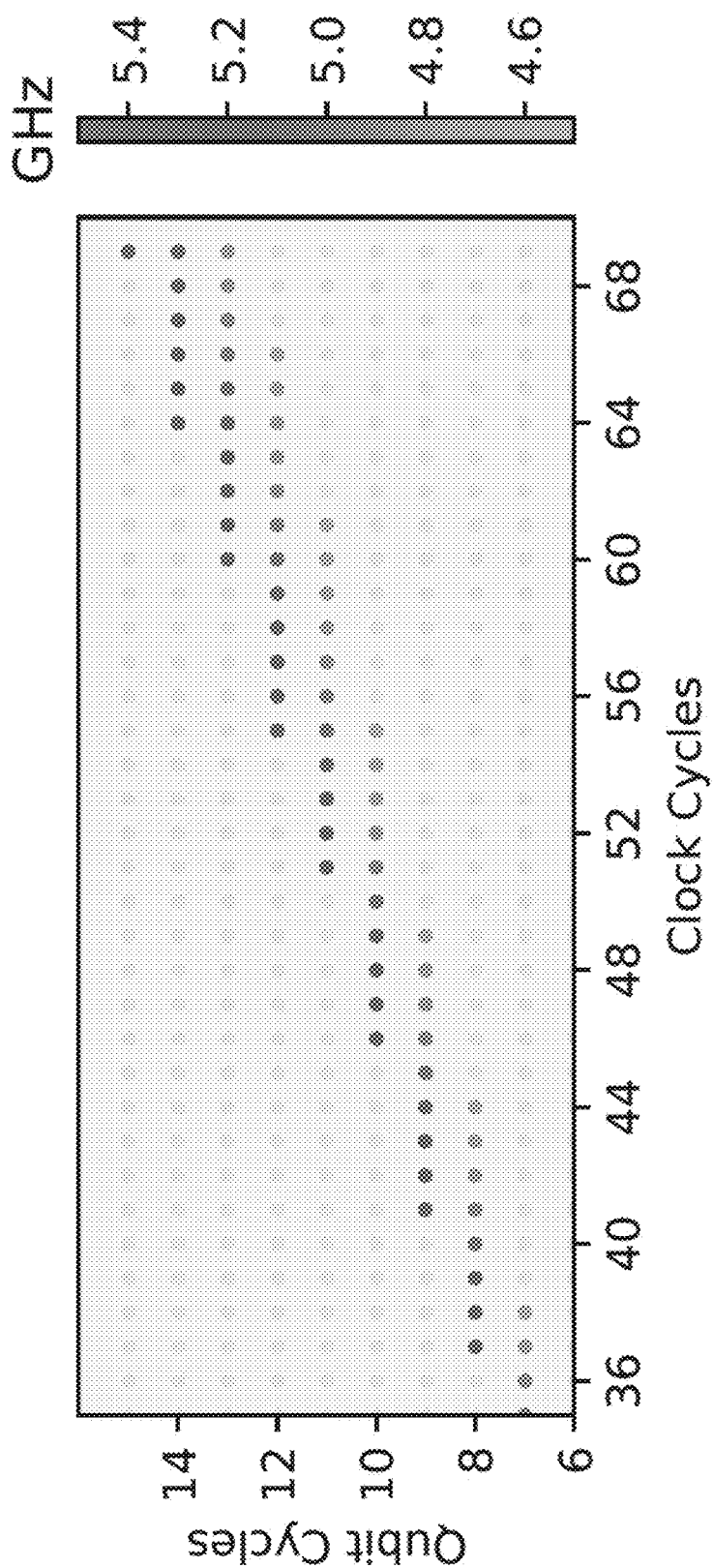
FIG. 3 is a map showing qubit frequencies permitting high-fidelity control, in accordance with the present disclosure.

To avoid such phase errors, the key is to tune the qubit frequency such that the total gate time $T_g$ corresponds to both an integer number $N_c$ of clock cycles $T_c$ and an integer number $N_q$ of qubit cycles $T_q$, so that $T_g = N_c T_c = N_q T_q$. This relation translates into the following frequency matching condition:

$$\frac{N_q}{\omega_q} = \frac{N_c}{\omega_c} \qquad (21)$$

where $\omega_c = 2\pi f_c$ is the angular frequency of the clock. To find frequencies that satisfy Eqn. 21, a map, as illustrated in FIG. 3, may be generated and used. Specifically, each grid point in FIG. 3 represents a qubit oscillation frequency that satisfies Eqn. 21, where the grid points highlighted in color span qubit frequencies from about 4.5 to 5.5 GHz, assuming an SFQ clock frequency of about 25 GHz. Of course, it may readily be understood that such map may vary depending on the selected SFQ clock frequency. For a small range of frequencies around qubit operating points satisfying Eqn. 21, accurate qubit control is possible.

From the frequency-matching relation Eqn. 21, it is clear that longer gate times will permit high-fidelity control of a larger number of distinct qubit frequencies. However, in accordance with aspects of the present disclosure, the number of register bits needed to describe the pulse sequence can be drastically reduced by the repeated streaming of high-fidelity subsequences. This strategy leads to compact registers that are efficient to implement in hardware, and it provides a desirable periodic suppression of leakage as a side effect, as discussed below.

Figure 4:
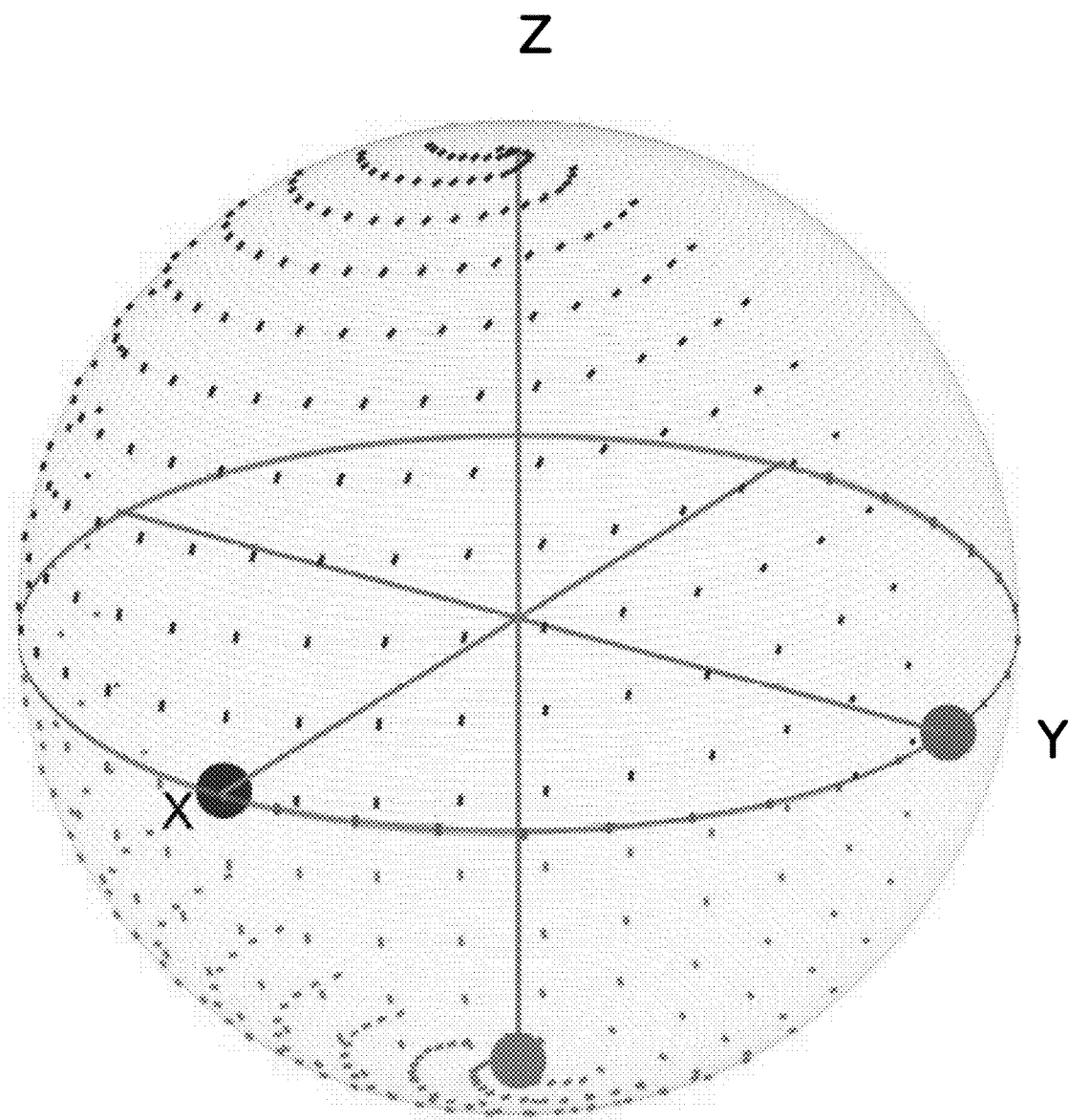
FIG. 4 is an illustration showing trajectories on the Bloch sphere for qubits initialized in states $|x_+\rangle$ (green), $|y_+\rangle$ (purple), and $|z_+\rangle$ (red).

Consideration of the trade-off between the number of register bits and the performance of the subsequence would help select the length of the subsequence. If the length is selected too short, the search space will likely be too restricted to produce high-fidelity gates, and the number of controllable qubit frequencies will likely be decreased (see FIG. 4). In some implementations, a good balance may be achieved for subsequences of approximately 35 to 55 bits, although other values may be possible. The number of subsequence repetitions, and thus the overall length of the gate, may be set by the size of the coherent rotation $\delta\theta$ imparted to the qubit per SFQ pulse. The relationship between gate time and tip angle is $T_g \propto T_c/(2\delta\theta)$, and it is tempting to reduce the gate time by increasing $\delta\theta$. However, errors that are second order in $\delta\theta$ will become significant for large tip angle. In some simulations, $\delta\theta \approx 0.03$ was found to be optimal, corresponding to a reasonable coupling capacitance from the SFQ driver to the qubit island of order 100 aF for typical transmon parameters. For the simulations described here, a $Y_{\pi/2}$ gate time of around 12 ns was targeted, although other gate times may be possible.

With this frequency-matching condition and approach to hardware optimization, basic subsequences may be constructed as follows. Given a number of clock cycles $N_c'$ and qubit cycles $N_q'$, for each clock cycle $i \in [0, N'_c]$, an SFQ pulse may be applied on a given clock edge provided the pulse induces a rotation in the positive y-direction. The subsequence may then be repeated an appropriate number of times to achieve the target rotation. Explicitly, an SFQ pulse is delivered to the qubit on the $k^{th}$ clock edge of the subsequence provided the following condition is fulfilled:

$$\left(N_q' \cdot \frac{k}{N_c'}\right)\text{mod}1 \leq 1/4 \text{ or } \geq 3/4. \qquad (22)$$

This class of subsequences is expected to yield reasonably high fidelity because it has a palindrome structure, which implies that pulses are delivered to the qubit as symmetric pairs. For example, the first and last pulses form the pair $(N_q', 0)$; the second and penultimate pulses form the pair $(N_q', \omega_q T_c)$, etc. In general, the sequence contains a pair $(N_q', k\omega_q T_c)$ for each k between 0 and 12 that satisfies Eqn. 22.

As an example, a sequence assembled from 10 repetitions of a basic subsequence using $N_c'=39$ and $N_q'=8$ was simulated. The qubit trajectory is plotted on the Bloch sphere shown in FIG. 4 for qubits initialized along the +x (green), +y (purple), and +z (red) directions. The tip angle $\delta\theta$ was selected to achieve a $Y_{\pi/2}$ rotation in 390 clock steps. Assuming a qubit anharmonicity of 250 MHz and a 25 GHz SFQ clock frequency, this sequence achieved fidelity of 99.9% in under 16 ns. Although this scheme for constructing basic subsequences demonstrates the possibility of controlling multiple qubit frequencies using a single global clock, it is by no means optimal, as the achieved fidelity is rather modest. The dominant source of infidelity is leakage from the computational subspace. In the following, an approach for suppressing this leakage is described.

An important aspect of the present SCALLOPS approach is the optimization algorithm utilized to eliminate leakage from the computational subspace. Starting with a basic subsequence, as described, bits are flipped to suppress leakage while preserving the target rotation in the qubit subspace. The major difficulty in subsequence optimization is that bit flips that reduce leakage may also generally disrupt the rotation achieved in the qubit subspace. This similar to solving a Rubik's cube. That is, when the cube mismatched at the top layer, a naive set of operations to complete the top layer will generally disrupt the other layers that are already matched. In this case, the difficulty can be circumvented by using operations whose net effect is felt only at the top layer.

A similar approach may also be used to suppress leakage. Specifically, a corresponding approach is to flip a symmetric pair of bits in the subsequence and to scale the tip angle $\delta\theta$ to preserve rotation in the qubit subspace. While this latter step might be unexpected given that $\delta\theta$ is fixed by the geometric coupling of the SFQ driver to the qubit, it will be shown that for a given qubit frequency satisfying the matching condition Eqn. 21 there exists a high density of high-fidelity subsequences in the space of tip angles $\delta\theta$. The strategy will be to allow $\delta\theta$ to vary as a cluster of high-fidelity, low-leakage subsequences is sought. Then, the subsequences are selected that achieve highest fidelity for the specific value of $\delta\theta$ dictated by the available hardware.

More formally, this method may be described in terms of a subsequence graph G=(V, E), where the vertices V represent individual SFQ subsequences with their optimal tip angles $\delta\theta$ and the connections E link subsequences that are separated by a single symmetric pair of bit flips. Explicitly, Each vertex V is described by a subsequence bit pattern S and its optimal tip angle $\delta\theta_{opt}$=arg max$_{\delta\theta}F_{avg}$.

Each connection E links subsequences (S, L) that differ by a single symmetric pair (m,$\phi$).

V and E are defined this way with the goal of separating control in the qubit subspace from leakage elimination. That is, navigation through the subsequence graph G preserves rotation in the qubit subspace, but movement from vertex to vertex can change leakage out of the computational subspace substantially, as seen from Eqn. 18.

Figure 5:
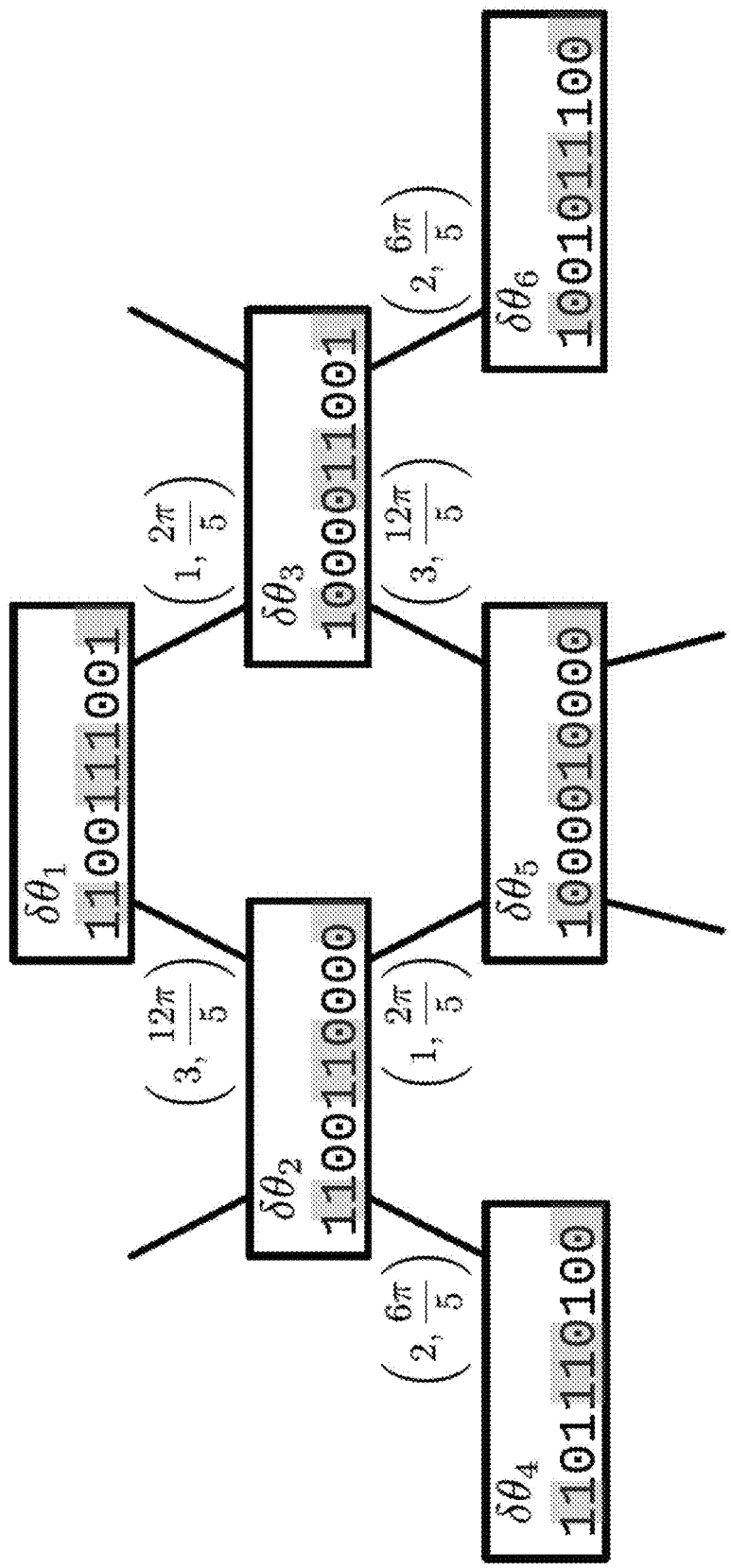
FIG. 5 is a graphical illustration showing a subsequence optimization algorithm, in accordance with aspects of the present disclosure.

For purposes of illustration, a trivial example of this optimization approach is shown in FIG. 5. In the figure, each vertex of the graph represents a 10-clock cycle (2-qubit cycle) subsequence with a distinct tip angle $\delta\theta$ in the qubit subspace (considering a 25 Gz clock and a 5 GHz qubit). The shaded regions reflect windows in which positive y-rotations can be induced by the application of SFQ pulses. Vertices that are connected differ by a single symmetric pair (m,$\phi$), which labels the connection. For example, the subsequence at the top of the figure differs from its neighbor on the left by the pair $$\left(3, \frac{12\pi}{5}\right),$$

corresponding to pulses applied on the sixth and ninth clock edges following initiation of the sequence (i.e. clock edge zero).

With this definition of the subsequence graph G, finding high-fidelity subsequences begins with a basic subsequence S as defined above. Such subsequence serves as the entrance point to the subsequence graph. Then, all vertices adjacent to S are explored, greedily moving to the vertex with the highest fidelity. This greedy move is then repeated until we reach a local fidelity maximum, which typically takes around 5 to 10 steps. In general, 5-8 repetitions of such high-fidelity subsequences will yield gates with fidelity greater than 99.99% in a total sequence time under 12 ns.

The subsequences assembled using the optimization algorithm described above are not yet sufficient for experimental implementation because the tip angle per SFQ pulse is allowed to vary during the search. In practice, the tip angle is determined by the coupling capacitance of the SFQ driver to the transmon qubit and cannot be exquisitely controlled during fabrication, or varied in situ following fabrication. To address this potential issue, a larger region of the subsequence graph may be explored to identify a large ensemble of high-fidelity candidate subsequences corresponding to a range of optimal tip angle $\delta\theta_{opt}$. For each of these subsequences, high-fidelity rotations (e.g. with infidelity under $10^{-4}$) are achieved over a range of $\delta\theta$, so that it is straightforward to identify from this ensemble specific subsequences that yield high fidelity for a fixed $\delta\theta$. More specifically, all vertices with fidelity lower than 99.99% may be ignored, and a standard breadth-first search may be performed to traverse the remaining vertices of the graph. This leads to a set of characterized subsequences referred to as the subsequence neighborhood.

Figure 6:
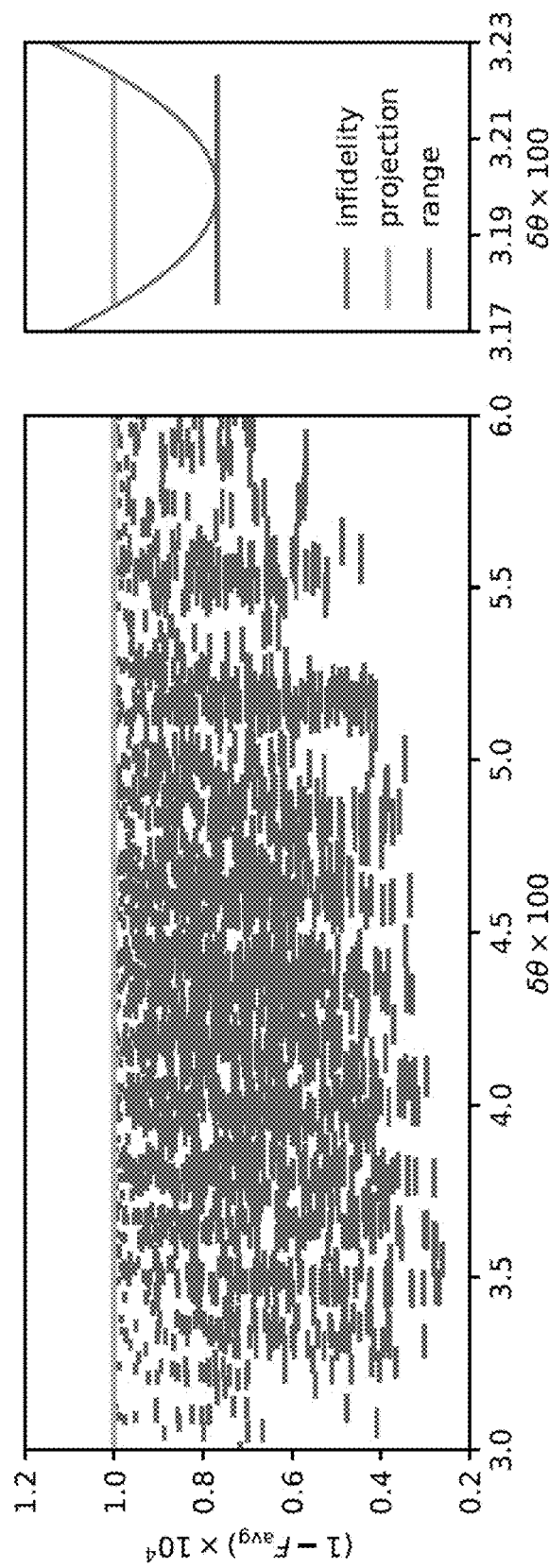
FIG. 6 is a graphical illustration showing gate infidelity versus tip angle $\delta\theta$.

Referring specifically to FIG. 6, an example plot of infidelities achieved versus the tip angle $\delta\theta$ for a subsequence neighborhood associated with a 4.65200 GHz qubit is shown. In the plot, each horizontal bar represents a unique subsequence. The bars are centered horizontally at the optimum tip angle $\delta\theta_{opt}$, and the vertical position of the bars represents the minimum subsequence infidelity. The horizontal extent of each bar denotes the range of $\delta\theta$ over which the infidelity of the subsequence remains below $10^{-4}$. For each individual subsequence in the neighborhood, high fidelity is reached for only a small range of tip angles around the optimal value. However, given a fixed value of $\delta\theta$, numerous subsequences are available that achieve gate fidelity well beyond the target of 99.99%. This is true for SFQ tip angle spanning a broad range from 0.03 to 0.06, which is more than enough to accommodate any inaccuracy in the design of the coupling capacitance between the SFQ driver and the transmon.

Figure 7:
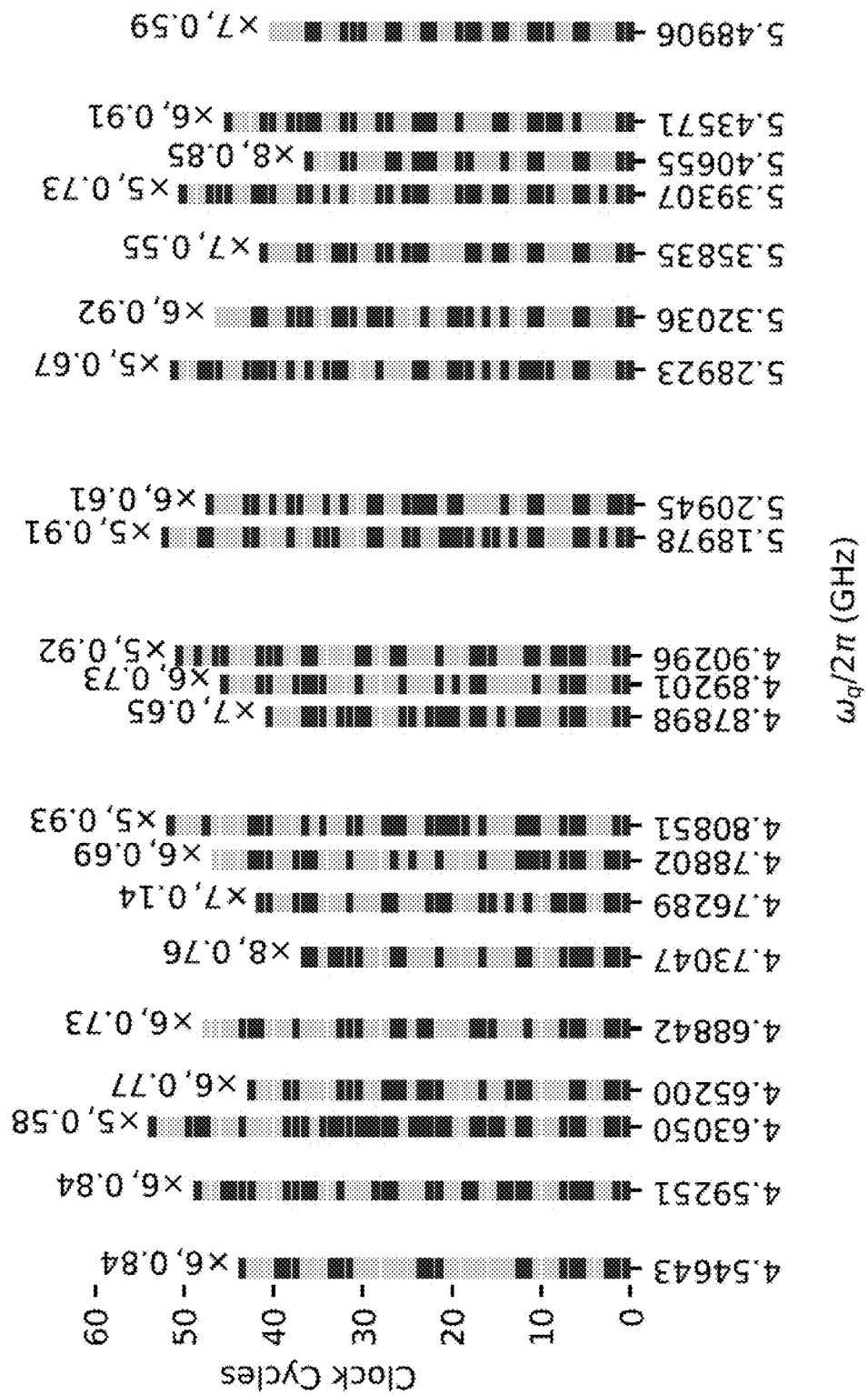
FIG. 7 is a graphical illustration showing SCALLOP subsequences, in accordance with aspects of the present disclosure.

For purposes of illustration, the above-described neighborhood search was performed for 21 different frequencies satisfying the matching condition given by Eqn. 21. The results are shown in FIG. 7. In the figure, each subsequence is labeled below with the frequency of the target qubits, and above with the achieved gate fidelity (in units of $10^{-4}$) and the number of repetitions required to achieve the $Y_{\pi/2}$ gate. For each sequence, time flows upward, where red (grey) bars correspond to clock cycles during which SFQ pulses are applied (omitted). The SCALLOP subsequences span 21 qubit frequencies, and share a fixed tip angle of 0.032. The frequency spacing of the subsequences is slightly adjusted for improved readability. To note, while a 3-level model of the transmon was used to derive the sequences, the presented fidelities were calculated for a model incorporating 7 energy levels.

Figure 8:
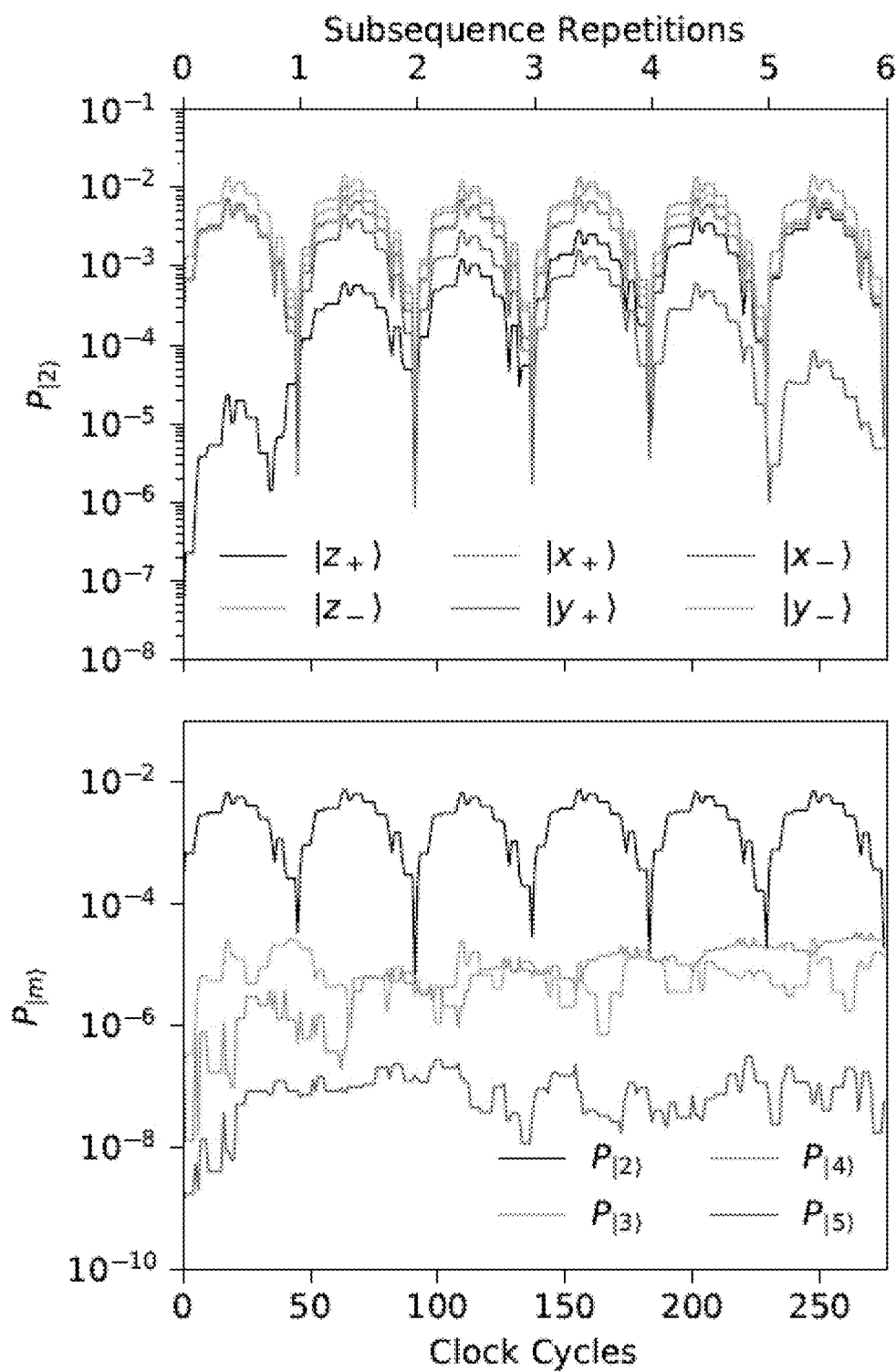
FIG. 8 are graphs showing leakage into non-computational states for the sequence of FIG. 6 corresponding to a 4.89201 GHz qubit.

With particular reference to FIG. 8, leakage into the non-computational states |2⟩, |3⟩, |4⟩, |5⟩ was examined for the SCALLOP sequence corresponding to the 4.89201

GHz qubit. The sequence involved 6 repetitions of a subsequence consisting of 46 bits. It was observed that the dominant leakage into state $|2\rangle$ was roughly bounded at $10^{-2}$ for initial qubit states spanning the cardinal points on the Bloch sphere. Moreover, as the qubit state approached $|0\rangle$, the leakage into $|2\rangle$ was particularly low, as demonstrated by the curves corresponding to initial states $|z_+\rangle$ and $|x_-\rangle$. While the population of state $|2\rangle$ can approach $10^{-2}$ toward the middle of the sub-sequence, the population always drops below $10^{-4}$ at the completion of each subsequence repetition, as the subsequences are explicitly constructed to minimize leakage from the qubit subspace. The population of states $|3\rangle$ and $|4\rangle$ was well below $10^{-4}$ throughout, while states $|5\rangle$ and higher had negligible populations.

Figure 9:
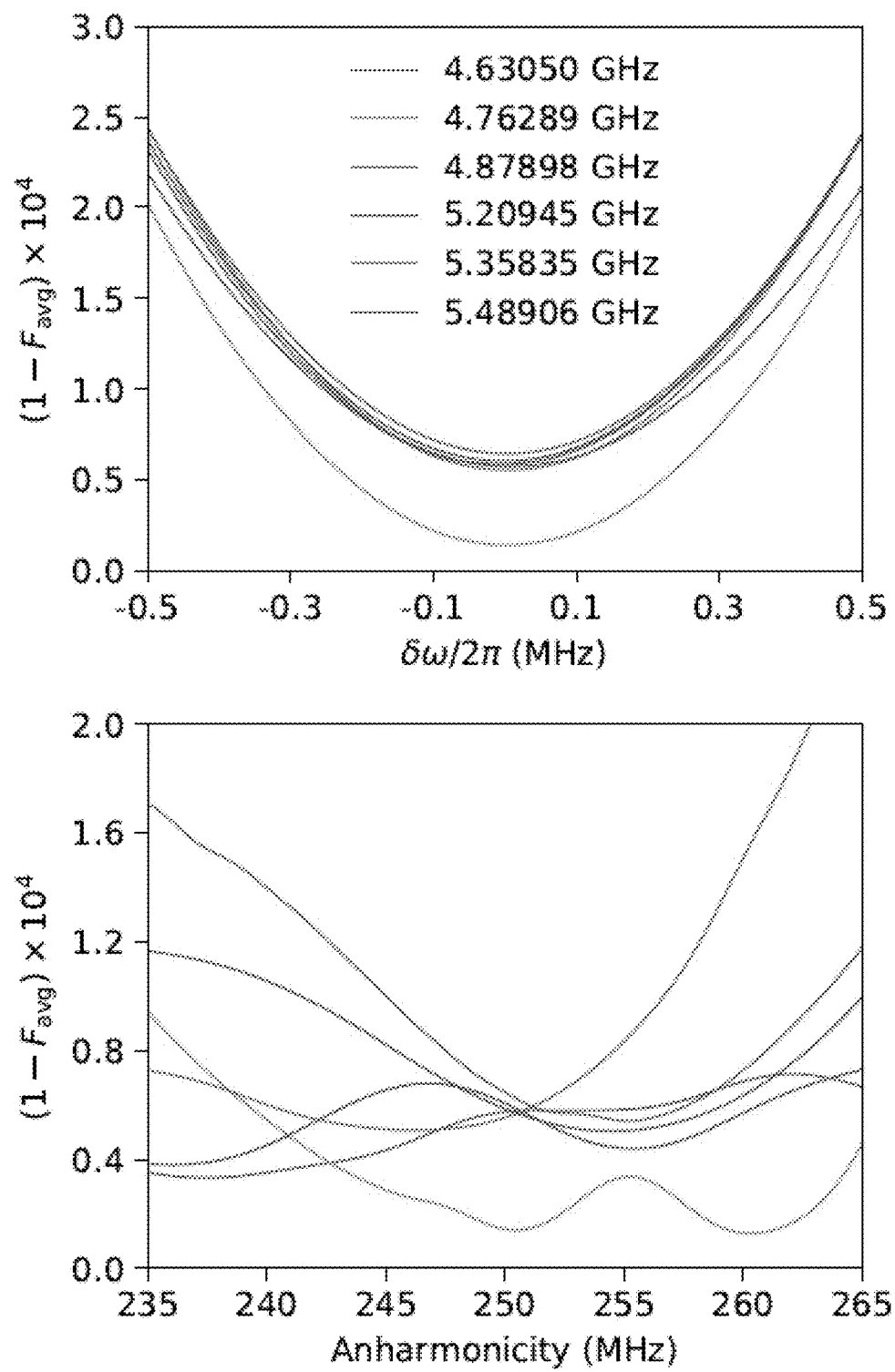
FIG. 9 are graphs showing sensitivity of gate fidelity to variation in qubit frequency and anharmonicity.

In addition, the effect of qubit frequency and anharmonicity variation on SCALLOPS gate fidelity was investigated, as shown in FIG. 9. In particular, error from frequency drift can be modeled as an ideal gate followed by a small precession: $U_{fr}(\delta\omega T_g/\omega_q)Y_{\pi/2}$. From Eqn. 13, the infidelity of this gate is then approximately $(\delta\omega T_g)^2/6$. For gate fidelity to degrade by $10^{-4}$, the qubit frequency drift $\delta\omega/2\pi$ must reach about 300 kHz, given a gate time of 12 ns. This naive estimate is in qualitative agreement with the full simulation results in FIG. 9 (upper graph). Note that based on the above argument, microwave-based qubit gates are expected to display similar sensitivity to qubit frequency drift. The lower graph of FIG. 9 also shows that SCALLOPS gate fidelity is relatively insensitive to variation in qubit anharmonicity. In a practical system, the anharmonicity of each qubit would be calibrated upon system bring-up. As anharmonicity is set by the transmon charging energy, it is not expected to fluctuate in time.

The above-described numerical simulations demonstrate coherent qubit control across multiple frequencies using irradiation with classical bits derived from the SFQ logic family. Using a single global clock at 25 GHz to stream pulses from compact registers consisting of 35-55 bits, gate fidelities better than 99.99% were achieved across 21 qubit frequencies spanning the range from 4.5 to 5.5 GHz. As appreciated from description herein, the present approach provides a number of advantages and solves a number of problems of prior attempts. For instance, control subsequences assembled using methods herein are readily amenable to storage in compact SFQ-based shift registers. In addition, the present approach is an intuitive and efficient method for the derivation of high-fidelity SFQ-based pulse sequences that is readily adapted to arbitrary single-qubit gates. Furthermore, the SCALLOPS method is robust in the sense that large imprecision in the tip angle per SFQ pulse is readily accommodated by appropriate variation in the subsequence bitstream. Moreover, the control approach is immune to wiring parasitic signals and offers the possibility for tight integration of a large-scale quantum array with a proximal classical coprocessor for the purposes of reducing system footprint, wiring heat load, and control latency.

Figure 10:
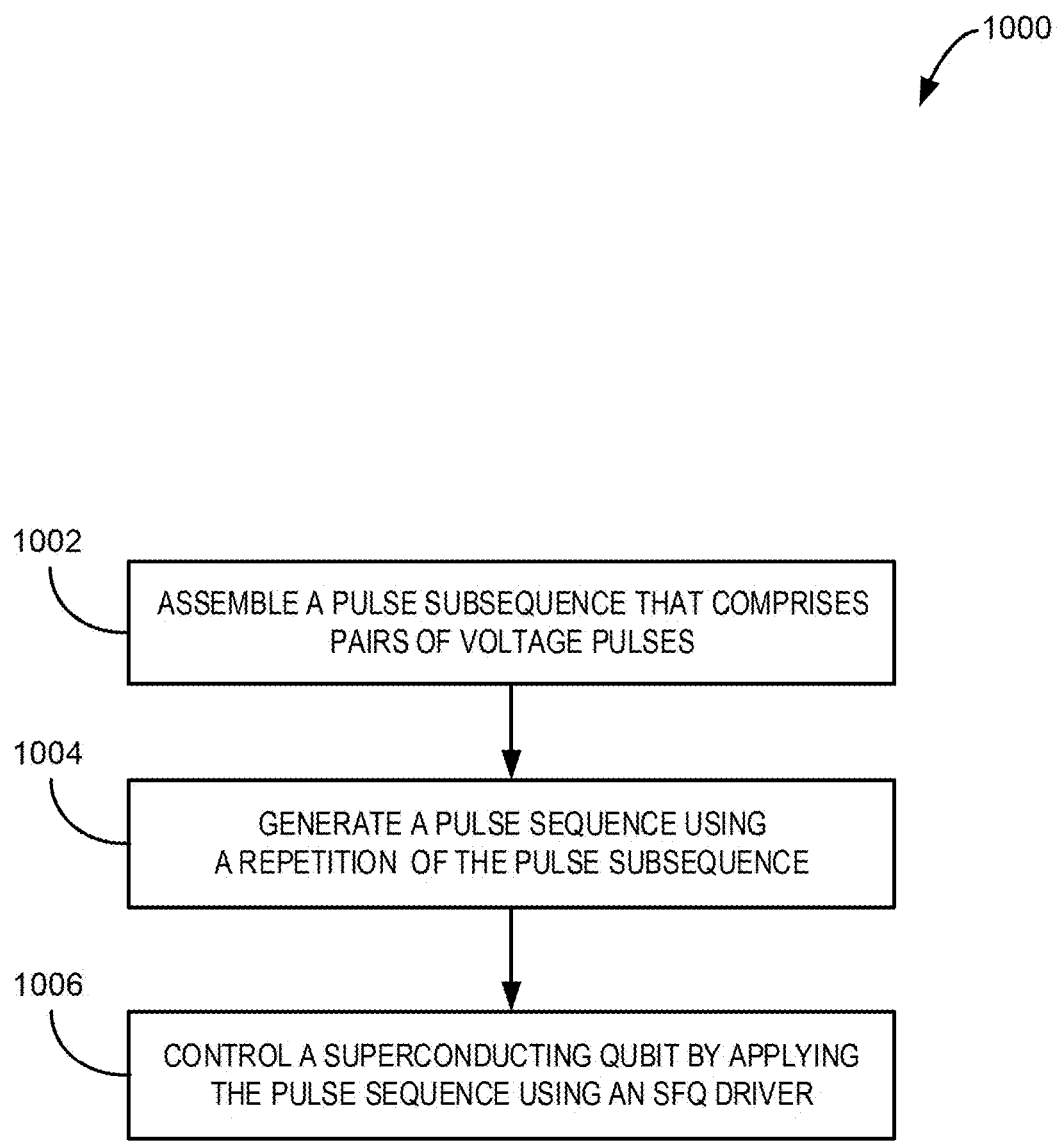
FIG. 10 is a flowchart setting forth steps of a process, in accordance with aspects of the present disclosure.

Referring now to FIG. 10, a flowchart setting forth steps of a process 1000 for controlling qubits, in accordance with the present disclosure, is shown. Steps of the process 1000 may be carried out using any suitable device, apparatus or system, such as systems described herein. Also, steps of the process 1000 may be implemented as a program, firmware, software, or instructions that may be stored in non-transitory computer readable media and executed by a general-purpose, programmable computer, processor or other suitable computing device. In some implementations, steps of the process 1000 may also be hardwired in an application-specific computer, processor or dedicated module.

The process 1000 may begin at process block 1002 with assembling a pulse subsequence using a controller of a quantum computing system. Specifically, the pulse subsequence includes pairs of voltage pulses timed symmetrically with respect to the period corresponding to the qubit frequency of a qubit. By way of example, the pulse subsequence may include approximately between 30 and 60 classical bits. As described, the assembled pulse subsequence may be optimized to minimize leakage from the computational subspace of the qubit.

Then, at process block 1004, a pulse sequence is generated using a repetition of a pulse subsequence, thereby reducing the resources required. In some aspects, the pulse sequence is configured to perform a gate on the qubit, although other control operations may be possible. The pulse sequence may then be applied using the SFQ driver to control the qubit, as indicated by process block 1006.

As described, in some aspects, multiple qubits in a qubit architecture may be controlled using the SFQ driver. To achieve this, the pulse subsequence assembled at process block 1002 should satisfy the frequency matching condition in Eqn. 20. That is, the qubit frequency for each qubit must be tuned such that a gate time associated with the pulse sequence corresponds to both an integer number of SFQ clock cycle and an integer number of qubit cycle.

The present invention has been described in terms of one or more preferred embodiments, and it should be appreciated that many equivalents, alternatives, variations, and modifications, aside from those expressly stated, are possible and within the scope of the invention.

The invention claimed is:

1. A quantum computing system comprising:
   a qubit architecture comprising a superconducting qubit described by a qubit frequency; and
   a single flux quantum ("SFQ") driver coupled to the superconducting qubit,
   wherein the SFQ driver is configured to provide a pulse sequence to control the superconducting qubit, the pulse sequence being generated using a repetition of a pulse subsequence that comprises pairs of voltage pulses timed symmetrically with respect to a period corresponding to the qubit frequency.

2. The system of claim 1, wherein the superconducting qubit comprises a transmon qubit.

3. The system of claim 1, wherein the at least one transmon qubit is capacitively coupled to the SFQ driver.

4. The system of claim 1, wherein the system further comprises a controller configured to direct the SFQ driver to provide the pulse sequence to the superconducting qubit in the qubit architecture.

5. The system of claim 4, wherein the controller is further configured to assemble the pulse subsequence using approximately between 30 and 60 classical bits.

6. The system of claim 4, wherein the controller is further configured to assemble the pulse subsequence to perform a gate on the superconducting qubit.

7. The system of claim 4, wherein the controller is further configured to optimize the pulse subsequence to minimize leakage from a computational subspace of the superconducting qubit.

8. The system of claim 4, wherein the controller is further configured to control multiple qubits in the qubit architecture using the SFQ driver by assembling the pulse subsequence to satisfy a frequency matching condition.

9. A method for controlling superconducting qubits, the method comprising:

assembling, using a controller of a quantum computing system, a pulse subsequence that comprises pairs of voltage pulses timed symmetrically with respect to a period corresponding to a qubit frequency of a superconducting qubit in the quantum computing system;

generating, using the controller, a pulse sequence using a repetition of a pulse subsequence; and controlling the superconducting qubit by applying the pulse sequence to the superconducting qubit using a single flux quantum ("SFQ") driver coupled thereto.

10. The method of claim 9, wherein the method further comprises controlling at least one transmon qubit that is capacitively coupled to the SFQ driver.

11. The method of claim 9, wherein the method further comprises assembling the pulse subsequence using approximately between 30 and 60 classical bits.

12. The method of claim 9, wherein the method further comprises assembling the pulse subsequence to perform a gate on the superconducting qubit.

13. The method of claim 9, wherein the method further comprises optimizing the pulse subsequence to minimize leakage from a computational subspace of the superconducting qubit.

14. The method of claim 9, wherein the method further comprises controlling multiple qubits in the qubit architecture of the quantum computing system using an SFQ driver coupled thereto.

15. The method of claim 14, wherein the method further comprises tuning the qubit frequency for selected qubits such that a gate time associated with the pulse sequence corresponds to both an integer number of SFQ clock cycles and an integer number of qubit cycles.

* * * * *

UNITED STATES PATENT AND TRADEMARK OFFICE
CERTIFICATE OF CORRECTION

PATENT NO. : 10,726,351 B1
APPLICATION NO. : 16/265867
DATED : July 28, 2020
INVENTOR(S) : Kangbo Li et al.

Page 1 of 2

It is certified that error appears in the above-identified patent and that said Letters Patent is hereby corrected as shown below:

In the Specification

Column 8, Eq. (5), "$H_{fr}^{(3)} = \frac{\hbar \omega_q}{2} \sum_z \hat{H}_{SFQ}^{(3)}(t) = \frac{\hbar \omega_y(t)}{2} \hat{\sum}_y$" should be --$H_{fr}^{(3)} = \frac{\hbar \omega_q}{2} \hat{\Sigma}_z H_{SFQ}^{(3)}(t) = \frac{\hbar \omega_y(t)}{2} \hat{\Sigma}_y$--.

Column 8, Eq. (6), "$\hat{\sum}_z = \begin{bmatrix} 0 & 0 & 0 \\ 0 & 2 & 0 \\ 0 & 0 & 4-2\eta \end{bmatrix}, \hat{\sum}_y = i \begin{bmatrix} 0 & -1 & 0 \\ 1 & 0 & -\lambda \\ 0 & \lambda & 0 \end{bmatrix}$" should be --$\hat{\Sigma}_z = \begin{bmatrix} 0 & 0 & 0 \\ 0 & 2 & 0 \\ 0 & 0 & 4-2\eta \end{bmatrix}, \hat{\Sigma}_y = i \begin{bmatrix} 0 & -1 & 0 \\ 1 & 0 & -\lambda \\ 0 & \lambda & 0 \end{bmatrix}$--.

Column 8, Eq. (7), "$U_{SFQ}^{(3)} = exp\left(-\frac{i\hat{\sum}_y}{2} \int_{-\infty}^{\infty} \omega_y(t)dt\right) = exp\left(\frac{-i\delta\theta \hat{\sum}_y}{2}\right)$," should be --$U_{SFQ}^{(3)} = exp\left(-\frac{i\hat{\Sigma}_y}{2} \int_{-\infty}^{\infty} \omega_y(t)dt\right) = exp\left(\frac{-i\delta\theta\hat{\Sigma}_y}{2}\right)$,--.

Column 8, Line 40, "$\hat{\sum}_y^3 = (\lambda^2+1)\hat{\sum}_y$" should be --$\hat{\Sigma}_y^3 = (\lambda^2+1)\hat{\Sigma}_y$--.

Signed and Sealed this
Sixth Day of October, 2020

Andrei Iancu
*Director of the United States Patent and Trademark Office*

CERTIFICATE OF CORRECTION (continued)
U.S. Pat. No. 10,726,351 B1

Column 8, Line 48, "$\sum_y^{\hat{n}} = (\lambda^2+1)^{\frac{n-2}{2}} \sum_y^{\hat{2}}$" should be --$\hat{\Sigma}_y^n = \left(\lambda^2+1\right)^{\frac{n-2}{2}} \hat{\Sigma}_y^2$--.

Column 8, Line 56, "$\sum_y^{\hat{n}} = (\lambda^2+1)^{\frac{n-1}{2}} \sum_y^{\wedge}$" should be --$\hat{\Sigma}_y^n = \left(\lambda^2+1\right)^{\frac{n-1}{2}} \hat{\Sigma}_y$--.

Column 8, Eq. (9), "$U_{SFQ}^{(3)} = \hat{1} + \sum_{even, n \geq 2}^{\infty} \frac{(\lambda^2+1)^{\frac{n-2}{2}} (-i\delta\theta/2)^n}{n!} \sum_y^{\hat{2}} + \sum_{odd, n \geq 1}^{\infty} \frac{(\lambda^2+1)^{\frac{n-1}{2}} (-i\delta\theta/2)^n}{n!} \sum_y^{\wedge}$"

should be --$U_{SFQ}^{(3)} = \hat{1} + \sum_{even, n \geq 2}^{\infty} \frac{(\lambda^2+1)^{\frac{n-2}{2}} (-i\delta\theta/2)^n}{n!} \hat{\Sigma}_y^2 + \sum_{odd, n \geq 1}^{\infty} \frac{(\lambda^2+1)^{\frac{n-1}{2}} (-i\delta\theta/2)^n}{n!} \hat{\Sigma}_y$--.

Column 11, Line 2, "nave" should be --naïve--.